(12) United States Patent
Mitra et al.

(10) Patent No.: US 7,187,021 B2
(45) Date of Patent: Mar. 6, 2007

(54) STATIC INDUCTION TRANSISTOR

(75) Inventors: Chayan Mitra, Bangalore (IN);
Ramakrishna Rao, Bangalore (IN);
Jeffrey Bernard Fedison, Niskayuna, NY (US); Ahmed Elasser, Latham, NY (US)

(73) Assignee: General Electric Company, Niskayuna, NY (US)

( * ) Notice: Subject to any disclaimer, the term of this patent is extended or adjusted under 35 U.S.C. 154(b) by 177 days.

(21) Appl. No.: 10/732,839

(22) Filed: Dec. 10, 2003

(65) Prior Publication Data

US 2005/0127396 A1 Jun. 16, 2005

(51) Int. Cl.
*H01L 29/772* (2006.01)
(52) U.S. Cl. ............... 257/264; 257/285; 257/E29.243
(58) Field of Classification Search ......... 257/256–287
See application file for complete search history.

(56) References Cited

U.S. PATENT DOCUMENTS

| | | | | |
|---|---|---|---|---|
| 4,799,090 A | * | 1/1989 | Nishizawa | 257/106 |
| 5,260,227 A | * | 11/1993 | Farb et al. | 438/192 |
| 5,903,020 A | * | 5/1999 | Siergiej et al. | 257/264 |
| 5,945,701 A | * | 8/1999 | Siergiej et al. | 257/285 |
| 2003/0116792 A1 | * | 6/2003 | Chen et al. | 257/220 |
| 2003/0178672 A1 | * | 9/2003 | Hatakeyama et al. | 257/328 |

OTHER PUBLICATIONS

Y. Uesugi, et al, "Generation of high heat flux plasmas by high power rf heating in the divertor plasma simulator NAGDIS-II", Vacuum 59 (2000) pp. 24-34.

Y.M. Sung et al, "A review of SiC Static induction transistor development for high frequency power amplifiers", Solid-State Electronics 46 (2002) pp. 605-613.

S. Ortolland et al, "Optimisation of a power 4H-SiC SIT device for RF heating applications", Materials Science and Engineering B 61-62 (1999) pp. 411-414.

* cited by examiner

*Primary Examiner*—Marcos D. Pizarro-Crespo
(74) *Attorney, Agent, or Firm*—Fletcher Yoder

(57) ABSTRACT

A transistor switch for a system operating at high frequencies is provided. The transistor switch comprises a graded channel region between a source region and a drain region, the graded channel region configured for providing a low resistance to mobile negative charge carriers moving from the source region to the drain region, wherein the graded channel comprises at least two doping levels.

23 Claims, 4 Drawing Sheets

STATIC INDUCTION TRANSISTOR

BACKGROUND OF THE INVENTION

The invention relates generally to transistor switches, and more specifically to transistor switches used for high frequency and high power applications.

Typically, in power electronic applications, it is desirable to operate at high switching frequencies especially in motor control and switch mode power supplies. For most of the high switching frequency applications in power circuits, it is generally required to use power devices with improved switching performance.

Gas discharge switches can be used for high frequency pulsed power applications. A few disadvantages of gas discharge switches are low repetition rates, short service lifetimes, weight and size. Such disadvantages can be overcome by using semiconductor switches. Semiconductor based switches typically have lower power dissipation, longer life, fast turn-on and turn-off, high blocking voltage and improved current handling capability.

PiN bipolar rectifiers are typically used in power circuits for rectification and as anti-parallel diodes for switches such as insulated gate bipolar transistors (IGBT) and metal oxide semiconductor field effect transistors (MOSFET). One limitation of such devices operating at high switching frequencies is the reverse recovery process when a large reverse transient current flows through the device thereby increasing the diode power dissipation and producing an undesirable stress upon the power transistors operating in the circuits. Other rectifiers such as Silicon Schottky rectifiers on the other hand exhibit poor, reverse blocking characteristics due to the Schottky barrier lowering effect and the large forward voltage drop that results when designed for high blocking voltage.

Power bipolar transistors are also used for high switching frequency and medium power applications. Most bipolar transistors are current controlled devices and a large reverse base drive current is often needed to get a fast turn-off. Such devices are prone to second breakdown failure mode under simultaneous application of high current and high voltage as usually encountered in inductive power circuits.

Static induction transistors can also be used for high switching frequency applications. Charge transport in such transistors is due to majority carriers (for example electrons) flow through the channel, which is controlled by a channel potential barrier "induced" by a drain-source and a gate-source potential. Such transistors are typically vertical channel structures with uniform doping in the channel region. On proper scaling of such devices, large current handling capacity and low power dissipation in the on-state can be achieved. One problem with such transistors when made in silicon is their inability to withstand high blocking voltage because of low bandgap energy.

It is therefore desirable to design a transistor switch that is suitable for operating in high switching frequency as well as withstanding high blocking voltages.

BRIEF DESCRIPTION OF THE INVENTION

Briefly, in accordance with one embodiment of the invention, a static induction transistor for a system operating at high switching frequencies is provided. The static induction transistor comprises a graded channel region between a source region and a drain region, the graded channel region configured for providing a low resistance to mobile negative charge carriers moving from the source region to the drain region, wherein the graded channel comprises at least two doping levels.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
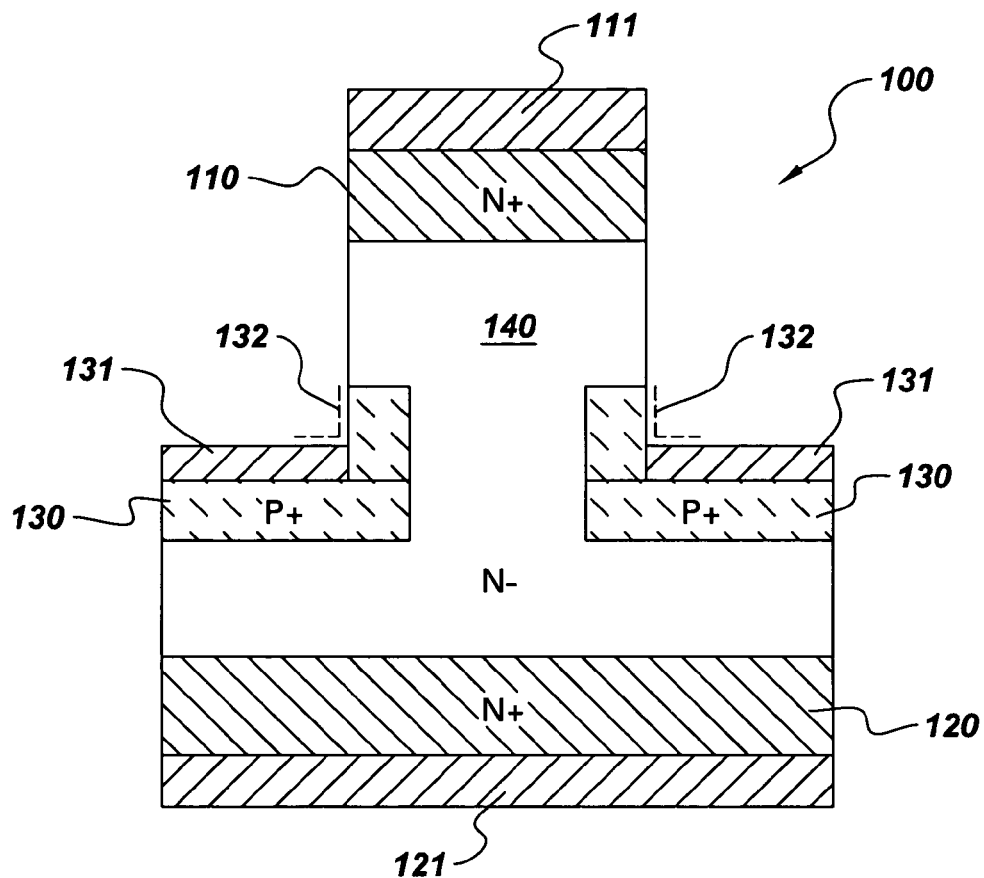
FIG. 1 is a cross-sectional view of an embodiment of a static induction transistor implemented according to one aspect of the invention.

FIG. 1 is a cross-sectional view of an embodiment of a static induction transistor implemented according to one aspect of the invention. Static induction transistor is an example of a transistor switch. Other examples of transistor switches include vertical field effect transistors (FETs) like JFETs and accumulation FETs (ACUFET). The description is continued with reference to static induction transistors but the design can be implemented in other embodiments of transistor switches as well.

In an embodiment, the static induction transistor is designed using a wide bandgap semiconductor material with a high thermal conductivity. As used herein, "wide bandgap" refers to a semiconductor material with a band gap of above 2.0 eV (electron-volts). Examples of wide bandgap materials include, but are not limited to Silicon Carbide, Zinc Oxide, Boron Nitride, Aluminum Nitride, Gallium Nitride and Diamond.

Static induction transistor 100 is shown comprising source region 110, drain region 120 and a gate region 130. The source region comprises source contact 111. Similarly the drain region and the gate region comprise drain contact 121 and gate contact 131 respectively. The source region and the drain region are negatively doped (n+) using mobile negative charge carriers whereas the gate region is positively doped (p+). In one embodiment, where the static induction transistor is designed using silicon carbide, the doping level of the source region and the drain region is $10^{18}/cm^3$.

As used herein, "adapted to", "configured" and the like refer to mechanical or structural connections between elements to allow the elements to cooperate to provide a described effect; these terms also refer to operation capabilities of electrical elements such as analog or digital computers or application specific devices (such as an application specific integrated circuit (ASIC)) that are programmed to perform a sequel to provide an output in response to given input signals.

The static induction transistor further comprises graded channel 140 disposed between the source region and the drain region. The graded channel is configured for providing a low resistance to mobile negative charge carriers moving from the source region to the drain region, wherein the graded channel comprises at least two doping levels. As used herein, "graded channel" refers to a channel that has multiple doping levels.

In one embodiment, the graded channel is doped at two doping levels. The doping level of the channel near the source region is higher than the doping level at the drain region. The graded doping results in a lower electric field near the source region compared to the drain region. The low resistance allows the electrons in moving with higher velocity towards the drain and thereby reducing the electron transit time. In addition, by controlling the thickness of the drift layers in the graded channel, higher breakdown voltages can be achieved.

Figure 2:
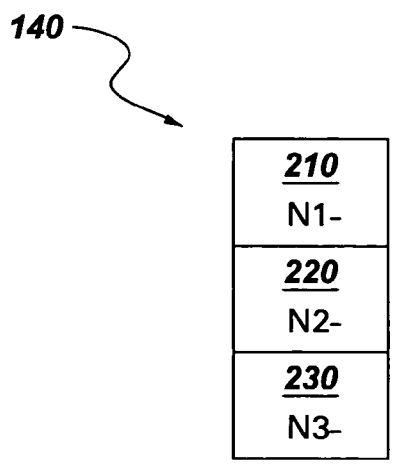
FIG. 2 is a cross-sectional view of an embodiment of a graded channel implemented according to one aspect of the invention.
Figure 3:
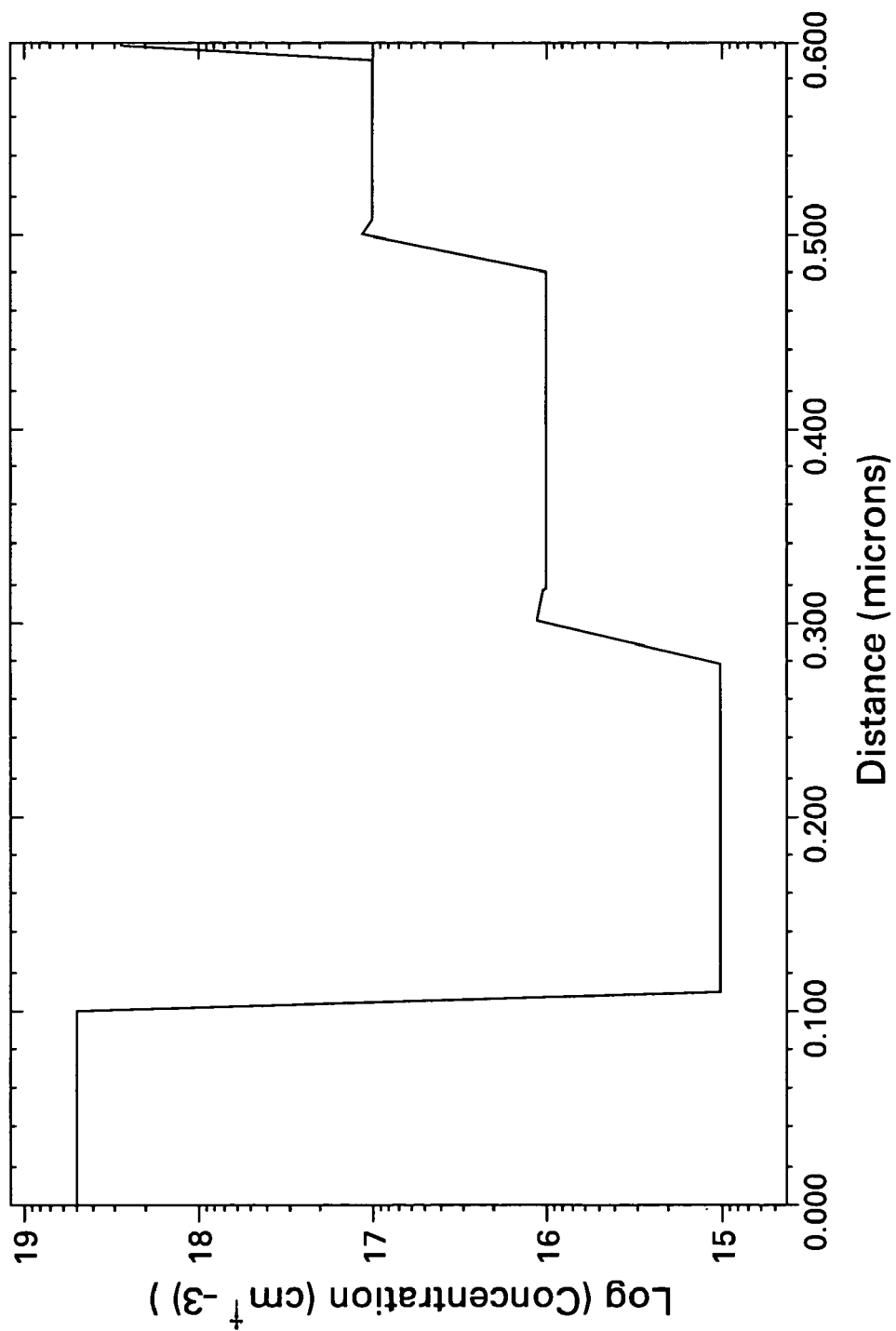
FIG. 3 is a graph illustrating a doping profile used for a graded channel implemented according to an aspect of the invention.

In one embodiment, illustrated in FIG. 2, the graded channel comprises three doping levels. The doping levels are typically greater than the intrinsic concentration of the material used in the static induction transistor. Further, the doping level is lower than the doping level of the source and drain regions of the static induction transistor. In an embodiment, wherein the static induction transistor is designed using silicon carbide and the source and the drain regions have a doping level of $10^{18}cm^3$, region 210 has a doping level of $10^{15}/cm^3$, region 220 has a doping level of $10^{16}/cm^3$, and region 230 has a doping level of $10^{17}/cm^3$. The intrinsic carrier concentration of silicon carbide at room temperature is on the order of $10^{-8}/cm^3$. The doping profile of the graded channel from the source region to the drain region is illustrated in FIG. 3. The x-axis represents a distance in microns and the y-axis represents the logarithm of the concentration of doping.

Figure 4:
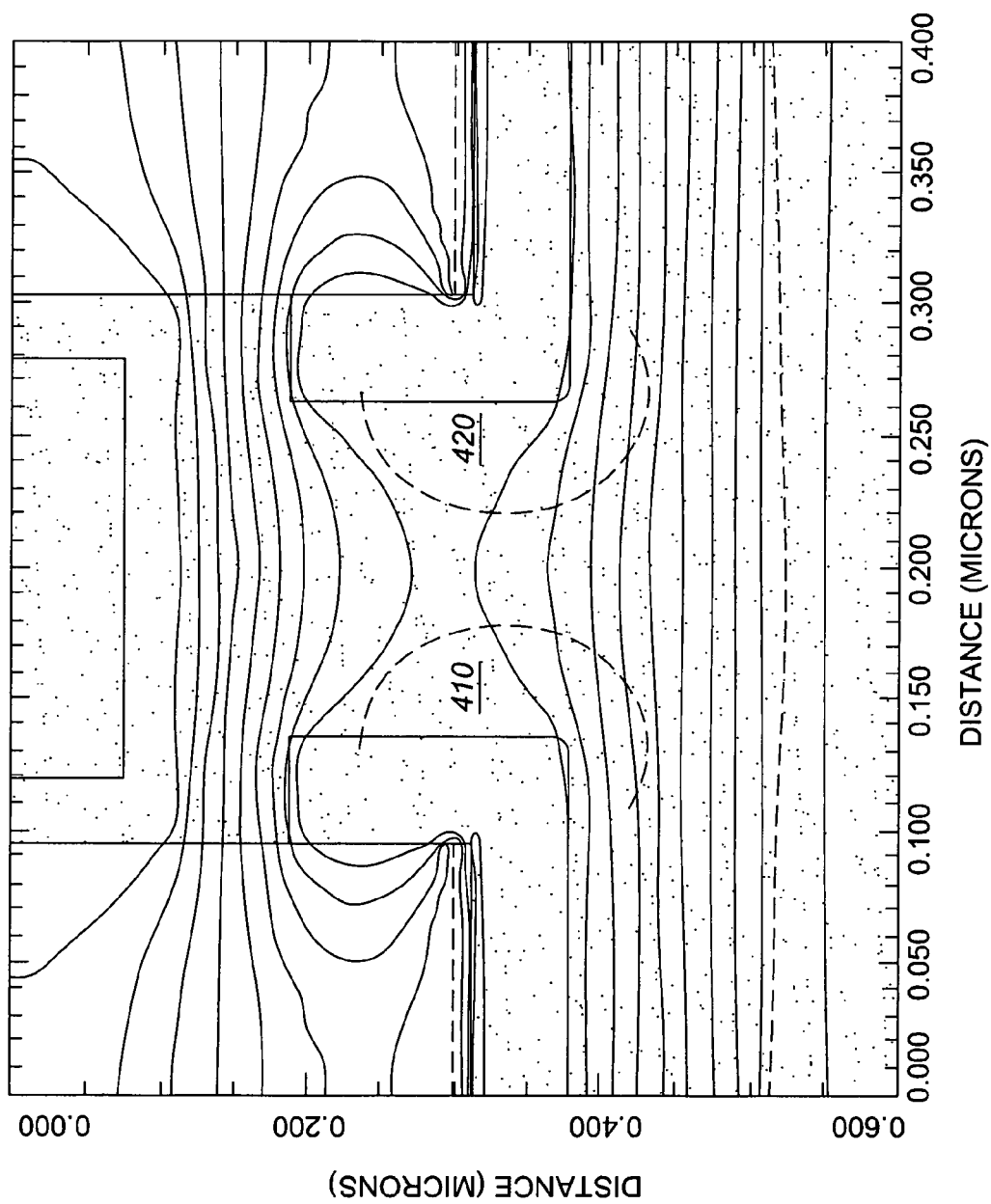
FIG. 4 is a block diagram illustrating an electrical field around a static induction transistor implemented according to an aspect of the invention.

Continuing with reference to FIG. 1, a further embodiment, of the invention comprises the gate region of the static induction transistor extending along a side wall 132 of the graded channel. By disposing the gate region along the side walls of the channel as shown in FIG. 1, the crowding of the electric field lines at the edges of the gate regions 410 and 420 is substantially reduced as shown in FIG. 4.

In one embodiment, the static induction transistor operates at a frequency of at least 1 MHz. In the embodiment, illustrated in FIG. 1, the static induction transistor operates at a frequency of more than 1 MHz. In other embodiments, the static induction transistors can operate at frequencies in the gigahertz range. In the embodiment, illustrated in FIG. 1, the static induction transistor operates at a frequency of more than 68 MHz. In another embodiment, the breakdown voltage of the static induction transistor is more than 60 Volts. In the embodiment of FIG. 1, the breakdown voltage of the static induction transistor is 210 Volts.

Figure 5:
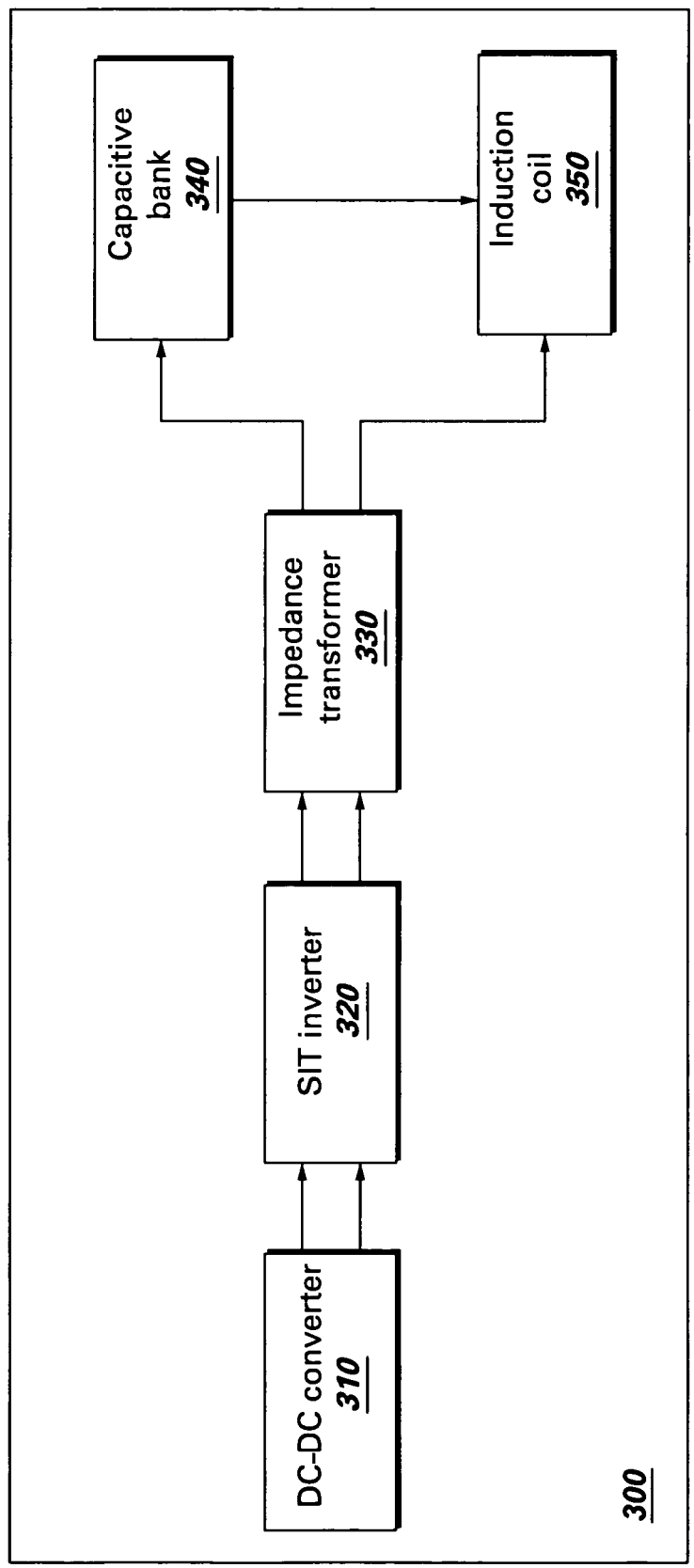
FIG. 5 is an embodiment of a high frequency, high power system employing the static induction transistor of FIG. 1 to which embodiments of the present invention are applicable.

FIG. 5 is one embodiment of a high frequency, high power system 300 employing the static induction transistor of FIG. 1 to which embodiments of the present invention are applicable. An example of system 300 is an RF power supply system. System 300 comprises DC-DC converter 310, SIT inverter 320, impedance transformer 330, capacitive bank 340 and induction coil 350. The operation of system 300 is described below.

DC-DC converter 310 is coupled to the SIT inverter 320 and supplies a direct current voltage. In an embodiment, maximum voltage and current of the converter is 400–600V and 80 A to 100 A respectively. The output RF power can be controlled by changing the DC output voltage using the dc-dc converter. The output of the SIT inverter 320 is coupled to an impedance transformer 330. The impedance transformer matches the SIT and induction coil 350. The system further comprises a capacitor bank 340, which is tuned to provide maximum current at the resonant frequency of the circuit comprising the induction coil and the capacitor bank. The driving frequency of the induction coil is modified by adjusting the corresponding frequency of the rectangular gate signals of the SIT inverter devices. The SIT implemented according to the invention is capable of operating at high switching frequencies in the megahertz (MHz) Range.

The previously described embodiments of the present invention have many advantages, including a low channel resistance resulting in a lower electron transit time due to the graded channel. In addition, field crowding effects in the channel region are substantially reduced due to the extended gate region over the walls of the graded channel. Another advantage is the higher breakdown voltages that are achieved by the design according to the invention.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A static induction transistor for a system operating at high frequencies, the static induction transistor comprising:
   a graded channel region between a source region and a drain region, the graded channel region configured for providing a low resistance to mobile negative charge carriers moving from the source region to the drain region; wherein the graded channel comprises at least two doping levels, wherein doping level at the source region is higher than doping level at the drain region; and wherein a gate region extends along the sides of the graded channel, wherein the gate region is directly in contact with a gate contact.

2. The static induction transistor of claim 1, wherein the doping level of the source region and the drain region is 5×1018 electrons/cm3 respectively.

3. The static induction transistor of claim 1, wherein the doping level of the gate region is 5×1018 holes/cm3.

4. The static induction transistor of claim 1, wherein the static induction transistor operates at a frequency of at least 1 MHz.

5. The static induction transistor of claim 1, wherein the static induction transistor operates at a frequency of more than 68 MHz.

6. The static induction transistor of claim 1, wherein the graded channel comprises three doping levels.

7. The static induction transistor of claim 6, wherein the doping levels of the graded channel are 1015 electrons/cm3, 1016 electrons/cm3, and 1017 electrons/cm3.

8. The static induction transistor of claim 1, wherein the breakdown voltage of the static induction transistor is more than 60 Volts.

9. The static induction transistor of claim 8, wherein the breakdown voltage of the static induction transistor is 210 Volts.

10. A transistor switch for a system operating at high frequencies, the transistor switch comprising:
    a graded channel region between a source region and a drain region, the graded channel region configured for providing a low resistance to mobile negative charge carriers moving from the source region to the drain region; wherein the graded channel comprises at least two doping levels; and a gate region extending along a side wall of the graded channel; wherein the gate region is directly in contact with a gate contact.

11. The transistor switch of claim 10, wherein doping level at the source region is higher than doping level at the drain region.

12. The transistor switch of claim 10, wherein the doping level of the source region and the drain region is 5×10^18 electrons/cm3 respectively.

13. The transistor switch of claim 10, wherein the doping level of the gate region is 5×10^18 holes/cm3.

14. The transistor switch of claim 10, wherein the transistor switch operates at a frequency of at least 1 MHz.

15. The transistor switch of claim 10, wherein the transistor switch operates at a frequency of more than 68 MHz.

16. The transistor switch of claim 10, wherein the transistor switch is implemented in high power generating systems.

17. The transistor switch of claim 10, wherein the transistor switch comprises a static induction transistor.

18. The transistor switch of claim 10, wherein the transistor switch is implemented using a wide bandgap material with a high thermal conductivity.

19. The transistor switch of claim 18, wherein the wide band gap material is selected from the group consisting of silicon carbide, gallium nitride, aluminum nitride, boron nitride, and diamond.

20. The transistor switch of claim 10, wherein the graded channel comprises three doping levels.

21. The transistor switch of claim 20, wherein the doping levels of the graded channel are 10^15 electrons/cm3, 10^16 electrons/cm3, and 10^17 electrons/cm3.

22. The transistor switch of claim 10, wherein the breakdown voltage of the transistor switch is more than 60 Volts.

23. The transistor switch of claim 22, wherein the breakdown voltage of the transistor switch is 210 Volts.

* * * * *